United States Patent
Schulze et al.

(10) Patent No.: US 11,378,426 B2
(45) Date of Patent: Jul. 5, 2022

(54) SYSTEM AND METHOD FOR MONITORING SENSOR LINEARITY AS PART OF A PRODUCTION PROCESS

(71) Applicant: APPLIED MATERIALS, INC., Santa Clara, CA (US)

(72) Inventors: Bradley D. Schulze, Phoenix, AZ (US); Michael D. Armacost, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1485 days.

(21) Appl. No.: 14/735,469

(22) Filed: Jun. 10, 2015

(65) Prior Publication Data

US 2015/0369640 A1    Dec. 24, 2015

Related U.S. Application Data

(60) Provisional application No. 62/014,994, filed on Jun. 20, 2014.

(51) Int. Cl.
   G01D 18/00     (2006.01)
   H01L 21/67     (2006.01)

(52) U.S. Cl.
   CPC ....... *G01D 18/00* (2013.01); *H01L 21/67253* (2013.01)

(58) Field of Classification Search
   None
   See application file for complete search history.

(56) References Cited

U.S. PATENT DOCUMENTS

| | | | |
|---|---|---|---|
| 5,642,296 A * | 6/1997 | Saxena | H01L 22/20 216/84 |
| 7,144,297 B2 | 12/2006 | Lin et al. | |
| 8,271,121 B2 | 9/2012 | Venugopal et al. | |
| 8,572,155 B2 | 10/2013 | Yanovich et al. | |
| 2007/0255442 A1* | 11/2007 | Nakamura | G05B 23/024 700/108 |
| 2008/0270162 A1* | 10/2008 | Machacek | G05B 23/0221 702/182 |
| 2010/0332011 A1* | 12/2010 | Venugopal | H01J 37/32935 700/109 |
| 2011/0251812 A1* | 10/2011 | Gurov | G01R 31/2894 702/82 |
| 2015/0177030 A1* | 6/2015 | Vilim | G01D 3/08 702/183 |

\* cited by examiner

*Primary Examiner* — Brent A. Fairbanks
(74) *Attorney, Agent, or Firm* — Moser Taboada

(57) ABSTRACT

Methods and systems for automated monitoring of sensors associated with a tool used in a manufacturing process are described. Sensor health may be evaluated based on the sensor's actual responses to set point changes. Rather than interrupt operation of the tool to determine whether one or more sensors are behaving in a predictable manner over an applicable range of operating conditions, pairs of set point values and sensor responses may be collected during the manufacturing process and stored in a time-indexed manner. A virtual model may be created for each sensor using selected ones of the indexed pairs and represented as points in an orthogonal coordinate system to identify a predictable operating region corresponding to the operating range. If a sensor response to a set point change, reflected in a stored, time indexed pair, is non-linear or offset relative to the predictable operating region, an alarm may be generated.

19 Claims, 8 Drawing Sheets

SYSTEM AND METHOD FOR MONITORING SENSOR LINEARITY AS PART OF A PRODUCTION PROCESS

CROSS-REFERENCE TO RELATED APPLICATIONS

This application claims benefit of U.S. provisional patent application Ser. No. 62/014,994, filed Jun. 20, 2014, which is herein incorporated by reference in its entirety.

FIELD

Embodiments of the present disclosure generally relate to a method and apparatus for automated monitoring of sensor performance in manufacturing equipment, especially, but not limited to, semiconductor manufacturing equipment using plasma chambers.

BACKGROUND

In such applications as robotics, biomedical, and manufacturing, sensors are used to provide feedback to a control system as to pressure, temperature, position, displacement, force, or acceleration. The measurements acquired by the sensors are so critical, in some applications, that operation of capital intensive and highly specialized processing equipment are periodically interrupted to ensure continued accuracy over the applicable operating range. One such application is the manufacture of semiconductor integrated circuits.

The manufacture of semiconductor integrated circuits is a detailed process having many complex steps. A typical semiconductor manufacturing plant (or fab) can use several hundred highly complex tools to fabricate intricate devices such as microprocessors or memory chips on a silicon substrate or wafer or other substrates. A single wafer often undergoes over 200 individual steps to complete the manufacturing process. These steps include lithographic patterning of the silicon wafer to define each device, etching lines to create structures, and filling gaps with metal or dielectric to fabricate the electrical device of interest. From start to finish, a semiconductor device fabrication process can take weeks to complete.

Faults can and do occur on semiconductor device manufacturing tools, which can, at any point, affect the yield and/or quality of the wafer and finished product. Indeed, a fault on a single wafer can compromise all devices on that wafer and all subsequent steps on that wafer may be worthless and the wafer scrapped. Timely and effective fault detection is therefore advantageous. Yet, the manufacturing tools themselves are also complex and many different faults can occur, some specific to the tool process being run at the time.

In the case of a plasma chamber, the process being run at any given time is known as the "recipe". As an example of the type of faults that can occur, consider a thermal chemical vapor deposition (CVD) tool, used to deposit layers of semiconductor or dielectric materials In the device manufacture. The quality of the process is determined by the output, measured by some metrics such as film uniformity, stress and so on. The quality of the output in turn depends on the process inputs, for example gas flow rates, reactor pressure and temperature in the case of the thermal CVD tool. If there is a deviation in any of the process parameters, then the quality of the output may be negatively impacted. Another type of fault concerns excursions within the process (e.g., errors in the manufacturing process that results in damage to the substrate or structures being formed on the substrate). There are many examples of excursions, including a compromise in chamber vacuum, a change in reactor wall conditions or chamber hardware, an electrical arc or even a problem with an incoming substrate. Again the quality of the output will be affected with possible impact on tool yield.

A common feature in all of the aforementioned faults is that sensors on the tool will generally indicate a change in system state. Plasma processing chambers, for example, are typically equipped with tool state sensors, for example gas flow meters and pressure gauges, and process state sensors, for example optical emission detectors and impedance monitors. If a process input changes, then, generally, some of the tool sensors will register that change. If the process reactor conditions change, again the tool sensors will register a change. However, should a sensor associated with a plasma processing chamber be permitted to return measured values, over the range of operating conditions encountered during the manufacturing process, which deviate from corresponding set point values, the ability of the sensor to detect and accurately register a change would be compromised. As a result, prevention or diagnosis of a fault, and/or mitigation of a fault's effects could be compromised.

Accordingly, the inventors have developed an improved system and method for monitoring the health of one or more sensors.

SUMMARY

Embodiments of the present disclosure provide methods and apparatus for monitoring the health of sensors associated with tools used in a manufacturing process such, for example, as semiconductor processing equipment.

In some embodiments, a plurality of sensors have a predictable operating behavior over a range of operating conditions applicable to a tool or processing system used in a manufacturing process. The sensors provide data sensitive to at least one of a tool state and a process state change. A computer implemented method of monitoring such sensors, according to one or more embodiments includes, while operating the tool or processing system during the manufacturing process, collecting at each of a plurality of points in time, a respective set point value associated with one of a target tool state and a target process state; and collecting from each respective sensor, at each of the plurality of points in time, a corresponding actual measurement value read back from the sensors.

In some embodiments, each collected measurement and associated process set points are stored together with an indication of an applicable time of actual measurement collection to create time indexed pairs of set points and actual measurements. The health of one or more sensors are evaluated by comparing recently collected sensor responses, as a function of set point, against a performance chart derived from previously collected indexed pairs of set points and actual set points. According to one or more embodiments, a performance chart for a virtual sensor is created, the virtual sensor corresponds to precisely one actual sensor, and is derived by fitting the time indexed pairs to a line bounded by the upper and lower limits of operating conditions encountered by the sensor during the applicable manufacturing process. Subsequent measurements from a sensor, each plotted as a function of a target process set point, are compared against the performance chart of the virtual sensor. The method generates and transmits an alert if one or more measurements, as a function of process set point, deviate sufficiently from the values predicted by the performance chart of the virtual sensor as to be a likely cause of a manufacturing defect.

According to one or more embodiments, the processing system(s) in which sensor monitoring is performed is a chamber used as part of a semiconductor manufacturing process. A plurality of virtual sensors are derived for each sensor, one for each recipe obtained by operation of the chamber. A system for implementing an automatic and non-disruptive sensor health monitoring scheme during execution of a recipe on a substrate within a processing chamber of a plasma processing system as part of a device fabrication process, comprises at least one sensor configured to collect sensor data to facilitate monitoring set points during execution of each recipe. The system further includes an interface configured to receive sensor data collected from the at least one sensor; and an analysis computer communicably coupled with said interface and having a memory and at least one processor configured to execute instructions stored in memory.

In some embodiments, a processor of the analysis computer is operative to execute instructions to store measurements returned by at least one sensor in response to set point changes. The processor is further operative, in some embodiments, to associate each measurement returned by the at least one sensor with a corresponding set point and a time of measurement to form time indexed pairs; and to evaluate health of the at least one sensor based on a plurality of measurements returned as a response to a corresponding set point change.

In some embodiments, a computer-implemented method is provided for automated monitoring of behavior of at least one sensor having a predictable operating behavior expected over a range of operating conditions applicable to a manufacturing process, wherein the at least one sensor is associated with a tool operated during the manufacturing process and provides data sensitive to at least one of a tool state or a process state change. In some embodiments, the method includes: while operating the tool during the manufacturing process, collecting at each of a plurality of points in time, a respective set point associated with a target tool state or a target process state, and collecting from the at least one sensor, at each of the plurality of points in time, a corresponding actual measurement value read back from the at least one sensor; storing the collected set points and actual measurements together with an indication of an applicable time of actual measurement collection to create time indexed pairs of set points and actual measurements corresponding to operation of the tool; and evaluating health of the sensor based on actual measured response of the at least one sensor to set point changes represented by the indexed pairs.

In some embodiments, a computer-implemented method is provided for automated monitoring of behavior of at least one sensor having a predictable operating behavior expected over a range of operating conditions applicable to a semiconductor manufacturing process, wherein the at least one sensor is associated with a semiconductor process tool operated during the semiconductor manufacturing process and provides data sensitive to at least one of a tool state or a process state change. In some embodiments, the method includes: while operating the tool during the semiconductor manufacturing process, collecting at each of a plurality of points in time, a respective set point associated with a target tool state or a target process state, and collecting from the at least one sensor, at each of the plurality of points in time, a corresponding actual measurement value read back from the at least one sensor; storing the collected set points and actual measurements together with an indication of an applicable time of actual measurement collection to create time indexed pairs of set points and actual measurements corresponding to operation of the tool; and evaluating health of the sensor based on actual measured response of the at least one sensor to set point changes represented by the indexed pairs.

In some embodiments, a system is provided for implementing an automatic and non-disruptive sensor health monitoring scheme during execution of a recipe on a substrate within a processing chamber of a plasma processing system as part of a device fabrication process. In some embodiments, the system includes: at least one sensor configured to collect sensor data to facilitate monitoring set points during execution of said recipe; an interface configured to receive sensor data collected from the at least one sensor; and an analytical computer system communicably coupled with said interface and having a memory and a processor configured to execute instructions stored in memory. The processor is operative to execute instructions in accordance with any of the methods disclosed herein.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
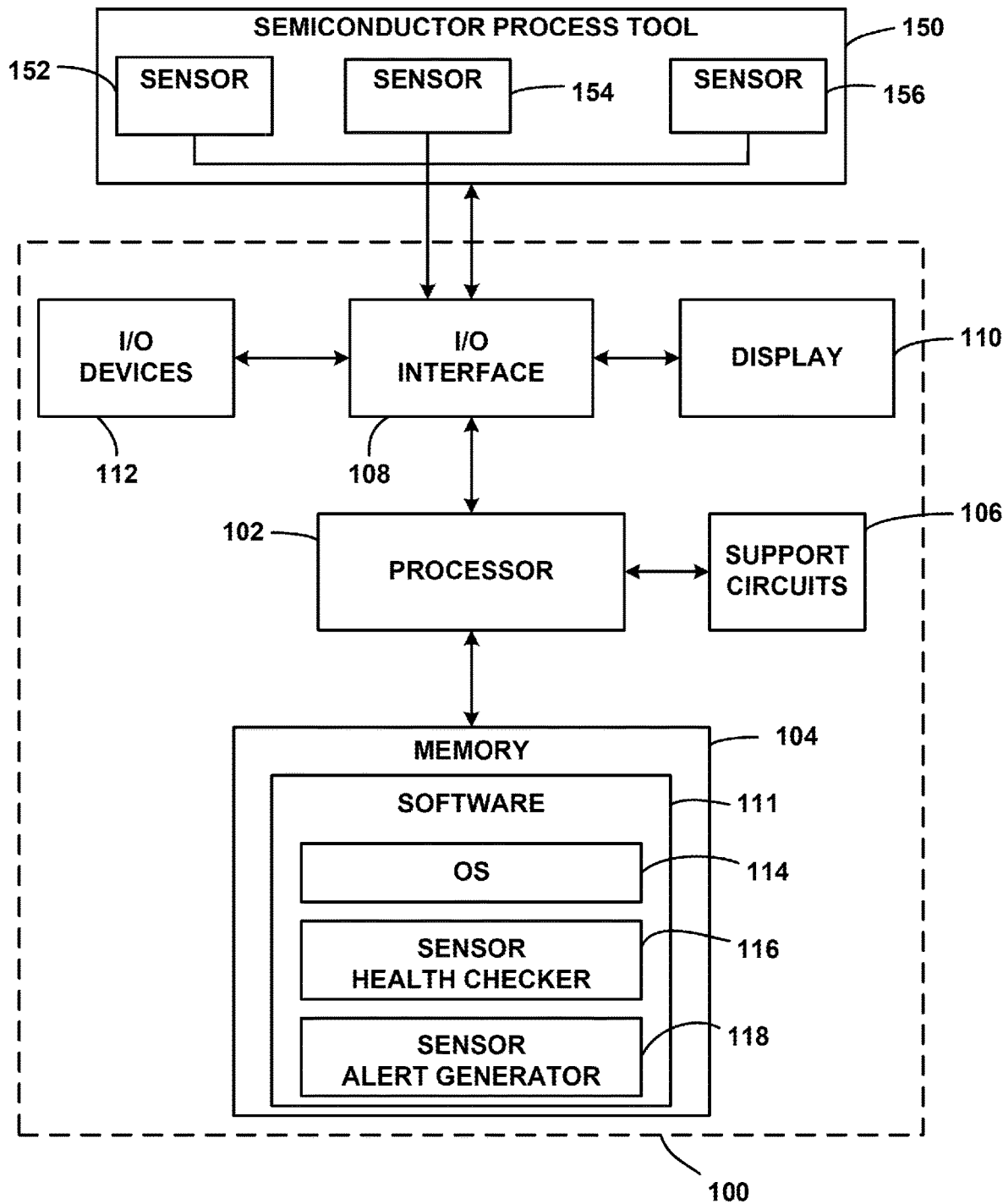
FIG. 1 is a schematic diagram of a generalized sensor-equipped tool associated with a manufacturing process, the sensors of the tool being monitored by an automated monitoring system in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Improved methods of operating a processing system or tool used in a manufacturing process, to periodically evaluate the health of one or more sensors (for example, critical to proper monitoring or performance of the process) without production downtime, are disclosed herein. The tool or processing system may be any suitable apparatus such, for example, as semiconductor processing equipment. According to at least some embodiments, the method is stored in the memory of a controller configured to control the apparatus. According to other embodiments, the instructions of the method which are associated with the monitoring of sensor health are stored in memory of an analysis computer system and executed by a processor independently of a processing system controller.

In some embodiments, the inventive method of using measurements to create virtual sensor may advantageously increase system utilization and therefore increase return on invested capital and profitability of operating a tool or processing system. Other benefits may also be realized via the methods and structures disclosed herein.

FIG. 1 is a block diagram depicting exemplary embodiments of an analytical computer system 100 communicatively coupled to a processing system, or tool 150, used in a manufacturing process. The analytical computer system 100 includes at least one processor as processor 102, a memory 104, various support circuits 106, input/output (I/O) interfaces 108, and a display 110. A "computer" as referred to herein can include at least the processor 102 and the memory 104. In general, the processor 102 may include one or more central processing units (CPUs). A CPU includes a circuit configured to execute program instructions ("software"). The support circuits 106 for the processor 102 include conventional cache, power supplies, clock circuits, data registers, I/O interfaces, and the like.

In an embodiment, I/O interfaces 108 are directly coupled to the memory 104 and, in other embodiments, I/O interfaces 108 are coupled through processor 102. The I/O interfaces 108 are coupled to the display 110 and I/O devices 112. The I/O devices include various devices (e.g., keyboard, mouse, etc.) used to collect or enter data and information. The memory 104 further includes one or more of the following random access memory, read only memory, magneto-resistive read/write memory, optical read/write memory, cache memory, magnetic read/write memory, and the like.

Memory 104 stores software 111 that includes program instructions configured for execution by processor 102. The software 111 includes an operating system (OS) 114, a sensor health checker tool ("sensor health checker 116"), and a sensor alert generating tool ("sensor alert generator 118"). In an embodiment, the operating system 114 provides an interface between the sensor health checker 116 and the analytical computer system 100. The operating system 114 may be implemented using various operating systems known in the art. In embodiments where analytical computer system 100 serves the additional purpose of controlling the tool 150 or a processing system comprising a plurality of such tools, memory 104 may further contain a process controller (not shown). In some such embodiments, tool 150 is a semiconductor process tool and analytical computer system 100 is coupled to the semiconductor process tool and the sensors thereof through I/O interfaces 108. Thus, output of the analytical computer system 100 can advantageously be used to control the tool 150 as part of a manufacturing process.

According to some embodiments, sensor health checker 116 is executed by processor 102, under control of operating system 114, to validate measurements returned by one or more sensors associated with tool 150, indicated generally at 152, 154 and 156, during the manufacturing process. Each sensor provides data sensitive to at least one of a tool state and a process state change and has a predictable operating behavior over a range of operating conditions applicable to the manufacturing process. By way of illustration, the respective measurements ("responses") returned by sensors 152, 154, and 156, as a function of a corresponding process or tool set-point, form a plurality of sets of time-indexed pairs. The sensor responses are governed, in some embodiments, by a linear relation over the portion of their operating range relevant to the manufacturing process. The response pairs are stored in memory 104, according to instructions of the sensor health checker 116 software executed by processor 102, to form a respective virtual tool for each sensor. When a subsequent sensor response collected during operation of the tool 150 or processing system does not correspond to a value predicted by the virtual tool, an alerting message (e.g., an alarm message) is generated and transmitted according to instructions of the sensor alert generator 118 software executed by processor 102.

Figure 2:
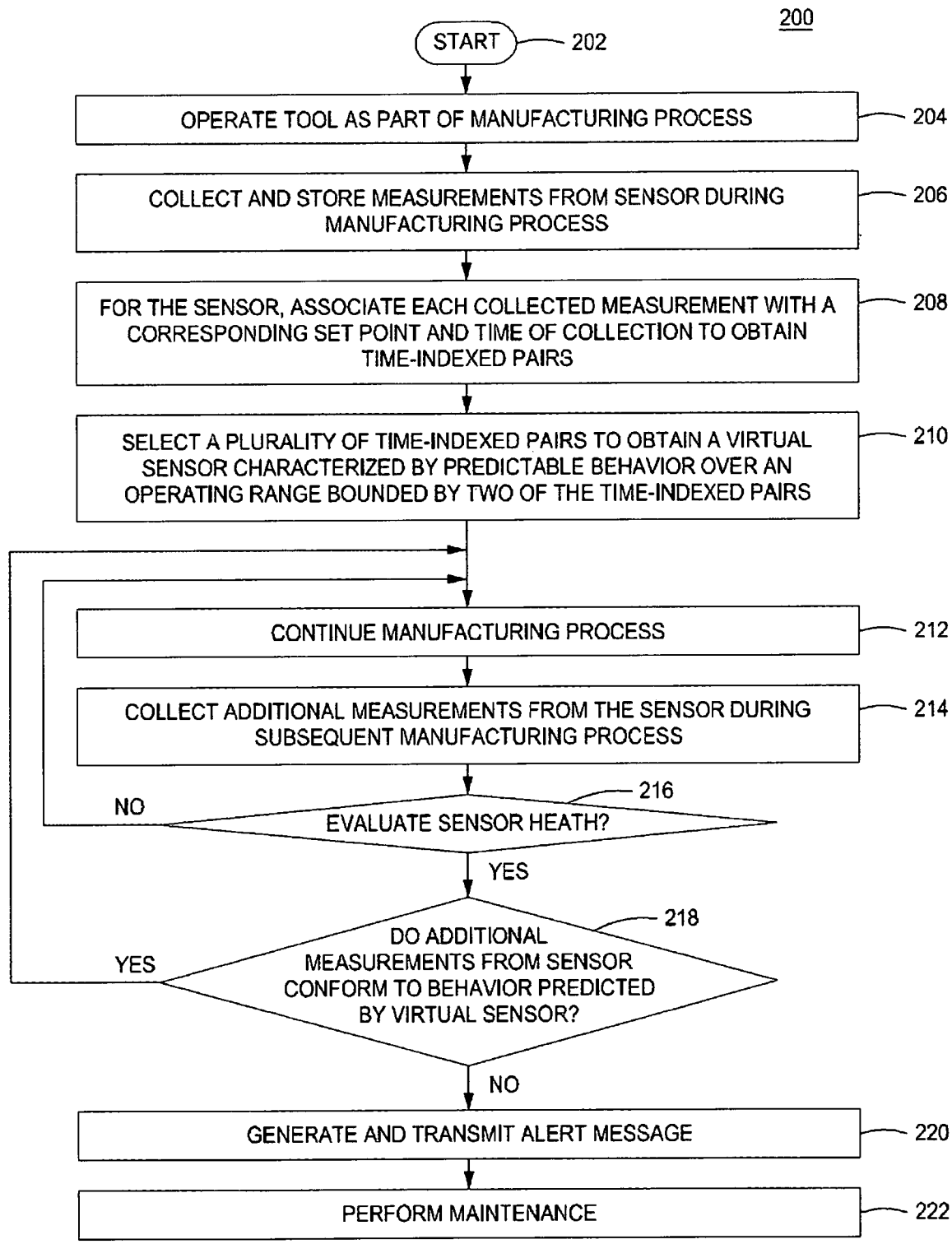
FIG. 2 is a flow chart depicting a process for monitoring sensor health in accordance with at least some embodiments of the of the present disclosure.

FIG. 2 is a flow chart depicting a sensor health monitoring method 200 in accordance with some embodiments of the present disclosure. An embodiment of the method is described below in connection with the exemplary tool 150 depicted in FIG. 1. Embodiments of method 200 are especially suited to the use of highly specialized equipment in complex manufacturing processes, particularly (but not limited to) those in which scheduled interruptions to accommodate sensor testing and calibration have heretofore been required in order to assure accurate detection of tool state and process state changes. The ability to detect non-conforming behavior in one or more sensors, without having to periodically interrupt the manufacturing process to one or more specialized diagnostic tests, results in a substantial reduction in equipment downtime and commensurate increase in an operator's return on capital investment.

In any event, and with continued reference to FIG. 2, the method 200 is entered at 202 and proceeds to 204 where, as depicted in FIG. 1, tool 150 is operated as part of a manufacturing process. At 206, responses returned from one or more of the sensors, as sensors 152, 154, and 156, are collected, at input/output interface 108 of analytical computer system 100, after each change in process or tool set point during the manufacturing process. At 208, each of the plurality of responses collected from a sensor is associated with a corresponding process set point and a time of collection. These time indexed, sensor response-set point value pairs are stored in memory 104 of analytical computer system 100, according to instructions executed by processor 102 in connection with the sensor health checker 116 program.

According to some embodiments, responses returned by one or more sensors are governed by a linear relationship to one another across the entire range of operating conditions encountered during one or more phases of the manufacturing process. At 210, a plurality of the stored sensor response-set point pairs are selected and used to model a virtual sensor. In some embodiments, 210 includes selecting a first set point and actual measured value (sensor response) pair corresponding to a lower limit of an operating range encountered by the tool 150 or processing system and a first sensor during a plurality of stages of the manufacturing process. In some embodiments, 210 further includes selecting a second set point and actual measured value pair corresponding to an upper limit of an operating range encountered by the tool 150 or processing system and the first sensor during a plurality of stages of the manufacturing process. In some embodiments, 210 further includes selecting at least one intermediate set point and actual measured value pair falling between the upper limit and the lower limit.

According to one or more embodiments, the selected time-indexed pairs are represented as points in an orthogonal coordinate system to identify a linear portion corresponding to the operating range. A slope characterizing the aforementioned linear relationship, which relationship governs a sensor's behavior over a predicted operating range of the sensor, is derived using a conventional method to define a virtual sensor for modeling the predicted behavior of the sensor during subsequent operations of the tool 150 or system. The same process is repeated for other sensors and other tools or processing systems used in the manufacturing process.

The method advances to 212, where the manufacturing process is continued. As part of the manufacturing process, additional measurements are collected, at 214, from each sensor. At 216, a determination is made as to whether it is time to evaluate the health of one or more sensors. According to some embodiments, the timing of such a determination is set according to a fixed schedule. According to other embodiments, the determination is made after each cycle of using a tool or processing system in a manufacturing process. If the determination is not to conduct an evaluation of sensor health yet, the process is returned to 212. Otherwise, the process advances to determination 218. At determination 218, the method evaluates one or more collected sensor responses for consistency with the response(s) predicted by the performance curve of the virtual sensor (e.g., linearity).

If the determination from 218 is that the collected responses are consistent with the predicted behavior, the method returns to 212 and the manufacturing process continues. If, however, the collected response(s) are not consistent (e.g., exhibiting non-linear behavior), the method 200 advances to 220. At 220, an alerting message is generated and transmitted to maintenance personnel, according to some embodiments, by analytical computer system 100. Maintenance is performed at 222 and operation of tool 150 or processing system resumes at 212.

The response pairs are stored in memory 104, according to instructions of the sensor health checker 116 software executed by processor 102, to form a respective virtual tool for each sensor. When a subsequent sensor response collected during operation of the tool 150 or processing system does not correspond to a value predicted by the virtual tool, an alerting message is generated and transmitted according to instructions of the sensor alert generator software (sensor health checker 116) executed by processor 102.

Figure 3:
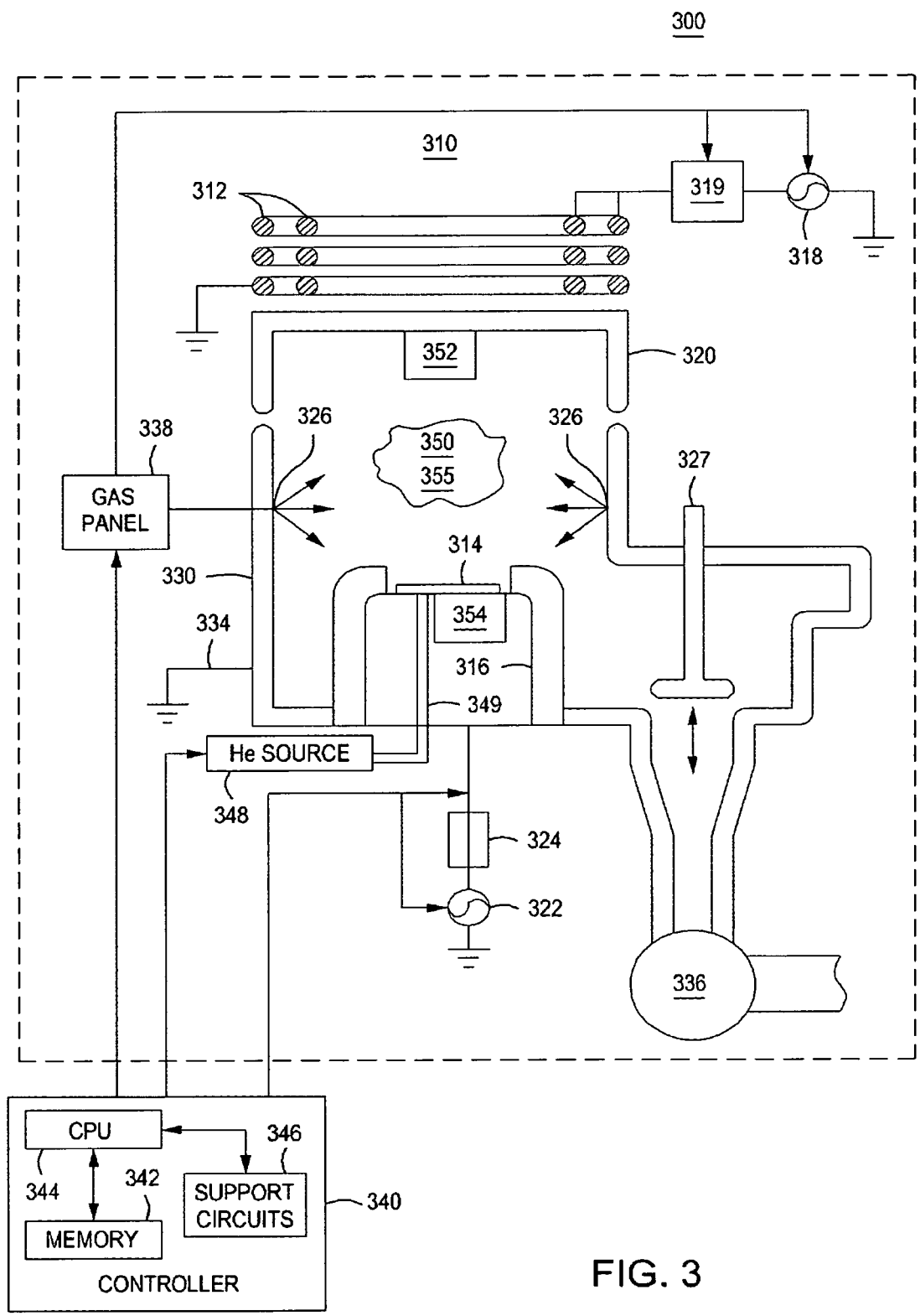
FIG. 3 is a schematic diagram of an etch chamber, the sensors of which are suitable for automated monitoring according to at least some embodiments of the present disclosure.

Applications especially suited to sensor health monitoring according to one or more embodiments include semiconductor processing systems. FIG. 3, for example, depicts a schematic diagram of an exemplary etch reactor 300 of the kind for which monitoring of sensor health according to one or more embodiments is especially suited. The reactor 300 may be utilized alone or, more typically, as a processing module of an integrated semiconductor substrate processing system, or cluster tool, such as a CENTURA® integrated semiconductor substrate processing system, available from Applied Materials, Inc. of Santa Clara, Calif. Examples of suitable etch reactors 300 include the DPS® line of semiconductor equipment (such as the DPS®, DPS® II, DPS® AE, DPS® G3 poly etcher, or the like), the ADVANTEDGE™ line of semiconductor equipment (such as the AdvantEdge, AdvantEdge G3), or other semiconductor equipment (such as ENABLER®, E-MAX®, or like equipment), also available from Applied Materials, Inc. The above listing of semiconductor equipment is illustrative only, and other etch reactors, and non-etch equipment (such as CVD reactors, or other semiconductor processing equipment) may suitably be used as well.

The reactor 300 comprises a process chamber 310 having a substrate support 316 within a conductive body (wall 330), and a controller 340. The substrate support 316 (cathode) is coupled, through a first matching network 324, to a biasing power source 322. The biasing power source 322 generally is a source of up to 500 W at a frequency of approximately 13.56 MHz that is capable of producing either continuous or pulsed power. In other embodiments, the biasing power source 322 may be a DC or pulsed DC source. The chamber 310 is supplied with a substantially flat dielectric ceiling 320. Other modifications of the chamber 310 may have other types of ceilings such as, for example, a dome-shaped ceiling or other shapes. At least one inductive coil antenna 312 is disposed above the ceiling 320 (two co-axial antennas 312 are shown in FIG. 3). Each antenna 312 is coupled, through a second matching network 319, to a plasma power source 318. The plasma power source 318 typically is capable of producing up to 4000 W at a tunable frequency in a range from 50 kHz to 13.56 MHz. Typically, the wall 330 is coupled to an electrical ground 334.

During a typical operation, a substrate 314, such as a semiconductor substrate, or wafer, is placed on the substrate support 316 and process gases are supplied from a gas panel 338 through entry ports 326 and form a gaseous mixture 350. The gaseous mixture 350 is ignited into a plasma 355 in the chamber 310 by applying power from the plasma power source 318 to the antenna 312. Optionally, power from the biasing power source 322 may be also provided to the substrate support 316. The pressure within the interior of the chamber 310 is controlled using a throttle valve 327 and a vacuum pump 336. The temperature of the chamber wall 330 is controlled using liquid-containing conduits (not shown) that run through the wall 330.

The temperature of the substrate 314 is controlled by stabilizing a temperature of the substrate support 316. Helium gas from a gas source 348 is provided via a gas conduit 349 to channels formed by the back of the substrate 314 and grooves (not shown) in the pedestal surface. The helium gas is used to facilitate heat transfer between the substrate support 316 and the substrate 314. During the processing, the substrate support 316 may be heated by a resistive heater (not shown) within the pedestal to a steady state temperature and then the helium gas facilitates uniform heating of the substrate 314. Using such thermal control, the substrate 314 may be maintained at a temperature of between 0 and 1100 degrees Fahrenheit (600 degrees Celsius). Sensors such as pressure sensor 352 and temperature sensor collect tool state or process state changes associated with corresponding changes in process set points.

Controller 340 comprises a central processing unit (CPU) 344, a memory 342, and support circuits 346 for the CPU 344 and facilitates control of the components of the etch process chamber 310 and, as such, of etch processes, such as discussed herein. The controller 340 may be one of any form of general-purpose computer processor that can be used in an industrial setting for controlling various chambers and sub-processors. The memory, or computer-readable medium, 342 of the CPU 344 may be one or more of readily available memory such as random access memory (RAM), read only memory (ROM), floppy disk, hard disk, or any other form of digital storage, local or remote. According to some embodiments, memory further includes the sensor health checker and sensor alert generator components identified by reference numerals 116 and 118 in the embodiment of FIG. 1.

The support circuits 346 are coupled to the CPU 344 for supporting the processor in a conventional manner. These circuits include cache, power supplies, clock circuits, input/output circuitry and subsystems, and the like. The inventive method may be stored in the memory 342 as software routine and may be executed or invoked in the manner described above. The software routine may also be stored and/or executed by a second CPU (not shown) that is remotely located from the hardware being controlled by the CPU 344.

Figure 4:
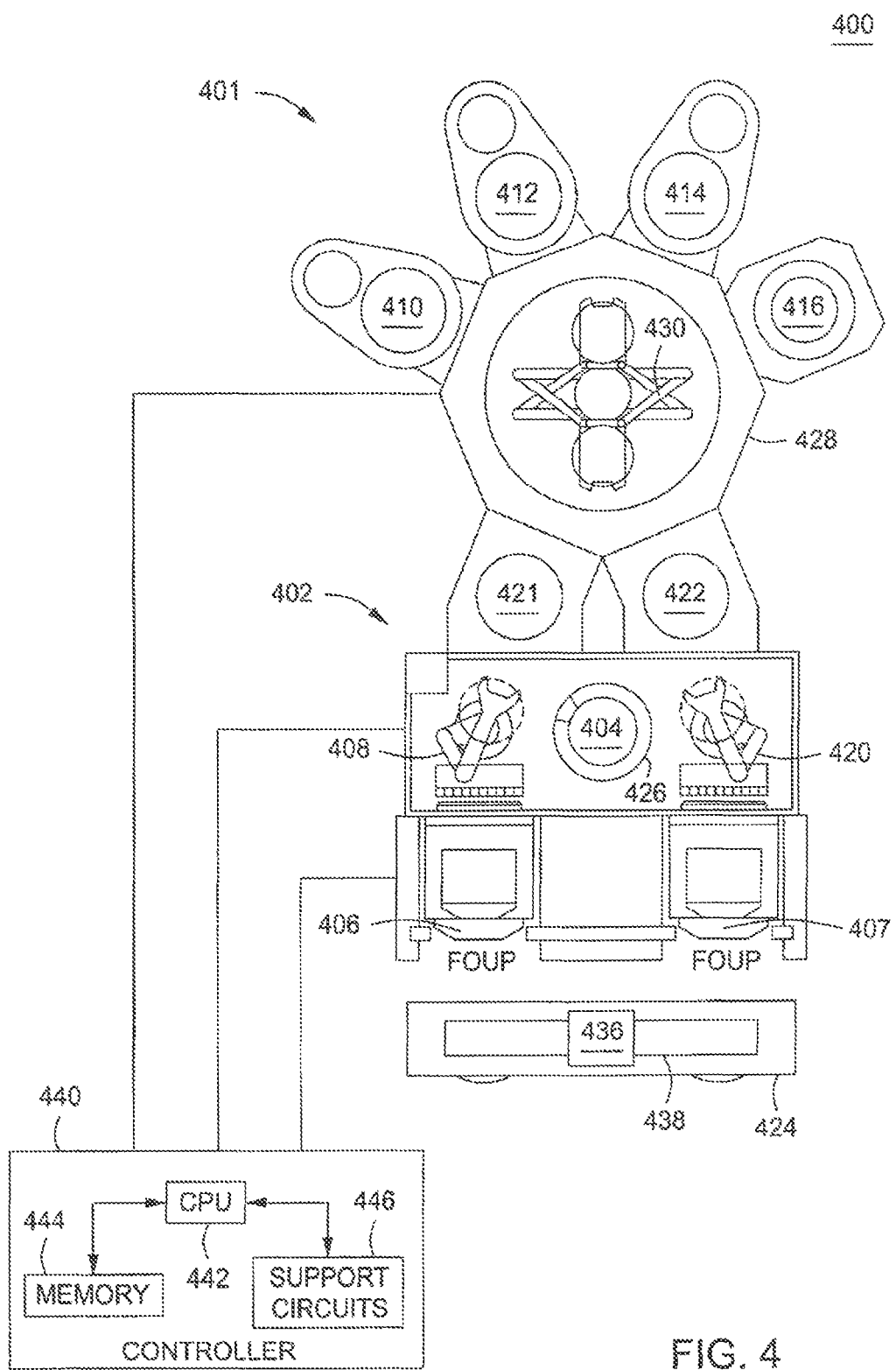
FIG. 4 is a schematic diagram depicting an exemplary integrated semiconductor processing system (e.g., a cluster tool) having sensors of a kind suitable for automated monitoring in accordance with at least some embodiments of the present disclosure.

FIG. 4 depicts a schematic diagram of an exemplary integrated semiconductor substrate processing system 400 (e.g., cluster tool) of the kind used in one embodiment of the disclosure. The system 400 illustratively includes a vacuum-tight processing platform 401, an input/output module 402, and a system controller 440. In some embodiments, the platform 401 comprises processing modules 410, 412, 414, and 416 and at least one load-lock chamber (load-lock chambers 421 and 422 are shown), which are coupled to a common vacuumed substrate transfer chamber 428.

The processing modules 410, 412, 414 and 416 may be any semiconductor processing module (e.g., a process chamber) suitable for practicing embodiments of the present disclosure including the semiconductor processing equipment described above. The load-lock chambers 421 and 422 protect the transfer chamber 428 from atmospheric contaminants. The transfer chamber 428 comprises a substrate robot 430. In operation, the robot 430 transfers the substrates between the load lock chambers and processing modules. The depicted embodiment of the robot 430 is illustrative only.

The input/output module 402 comprises a metrology module 426, at least one docking station to accept one or more front opening unified pod (FOUP) (FOUPs 406 and 407 are shown) and at least one substrate robot (two robots 408 and 420 are shown). In one embodiment, the metrology module 426 comprises a measuring tool 404 employing at least one non-destructive measuring technique suitable for measuring critical dimensions of structures formed on the substrate. One suitable measuring tool 404 that optically measures critical dimensions is available from Nanometrics, located in Milpitas, Calif. The robots 408 and 420 transfer the pre-processed and post-processed substrates between the FOUPs 406, measuring tool 404, and load-lock chambers 421, 422. In the depicted embodiment, the metrology module 426 is used as a pass-through module. In other embodiments (not shown), the metrology module 426 may be a peripheral unit of the input/output module 402. The processing system having a measuring tool is disclosed, for example, in commonly assigned U.S. Pat. No. 6,150,664, issued Nov. 21, 2000.

The factory interface 424 is generally an atmospheric pressure interface used to transfer the cassettes with pre-processed and post-processed substrates (e.g., wafers) disposed in the FOUPs 406, 407 between various processing systems and manufacturing regions of the semiconductor fab. Generally, the factory interface 424 comprises a substrate-handling device 436 and a track 438. In operation, the substrate-handling device 436 travels along the track 438 to transport the FOUPs between cluster tools or other processing equipment. The system controller 440 is coupled to and controls modules and apparatus of the integrated processing system 400. The system controller 440 controls aspects of operation of the system 400 using a direct control of modules and apparatus of the system 400 or, alternatively, by controlling the computers (or controllers) associated with these modules and apparatus. In operation, the system controller 440 enables data collection and feedback from the respective modules (e.g., metrology module 426) and apparatus that optimizes performance of the system 400.

The system controller 440 generally comprises a central processing unit (CPU) 442, a memory 444, and support circuits 446. The CPU 442 may be one of any form of a general purpose computer processor that can be used in an industrial setting. The support circuits 446 are conventionally coupled to the CPU 442 and may comprise cache, clock circuits, input/output subsystems, power supplies, and the like. The software routines, when executed by the CPU 442, transform the CPU into a specific purpose computer (controller) 440. The software routines may also be stored and/or executed by a second controller (not shown) that is located remotely from the system 400.

Embodiments of the inventive method, as described in detail below, are stored in the memory 444 as a software routine. The software routine may also be stored and/or executed by a second CPU (not shown) that is remotely located from the hardware being controlled by the CPU 442. In operation, the controller 440 issue instructions to perform the inventive methods to the system 400 directly, or alternatively, via other computers or controllers (not shown) associated with the processing modules 410-416 and/or their support systems. Alternatively, as described above, the inventive methods are contained on the controllers associated with the processing modules 410-416.

Figure 5:
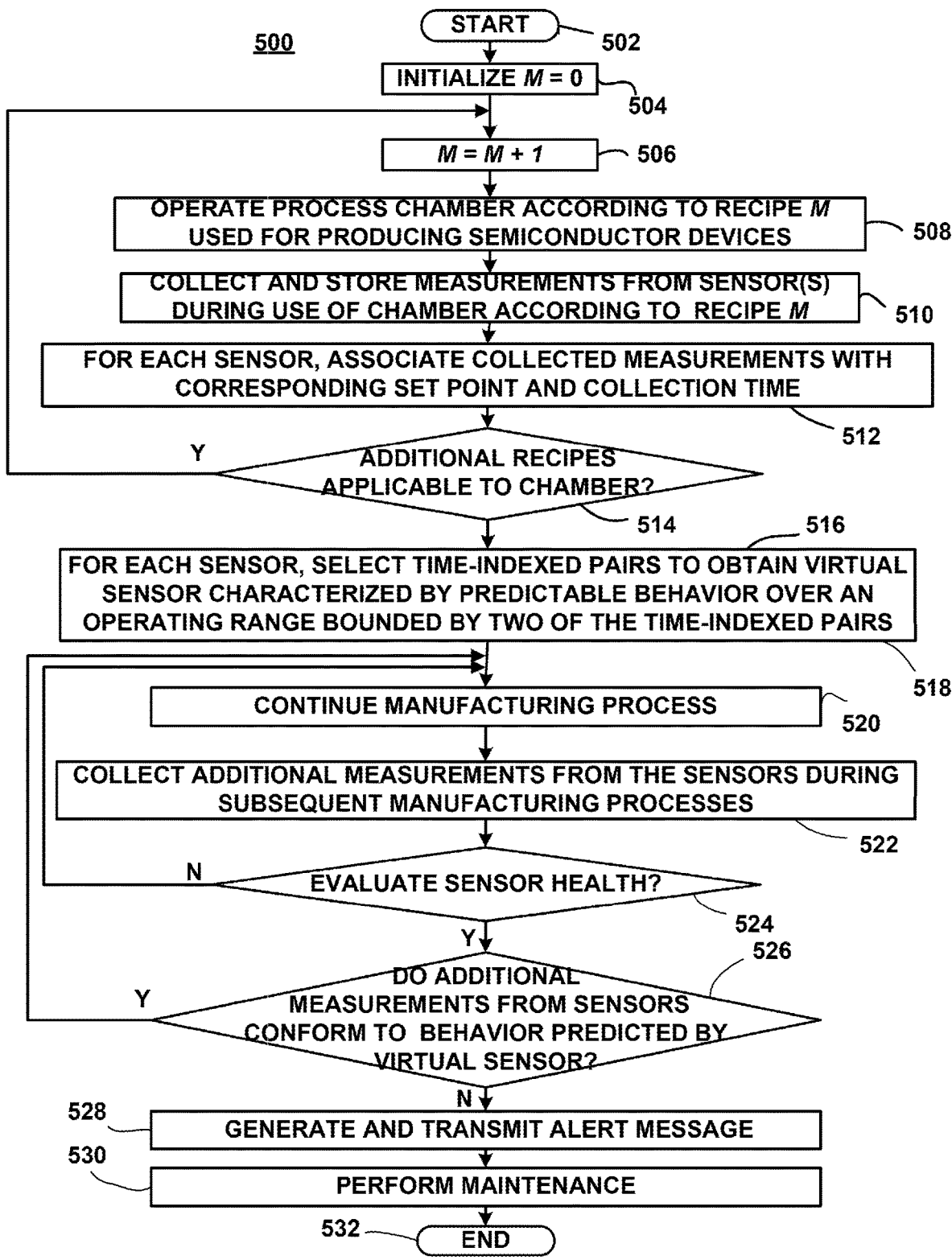
FIG. 5 is a flow diagram depicting a process for monitoring sensor health in a semiconductor processing system as part of a manufacturing process according at least some embodiments of the present disclosure.

Turning now to FIG. 5, embodiment of a method for monitoring sensor health in semiconductor processing equipment will now be described in detail. The method 500 is entered at 502 and proceeds to recipe count initialization at 504, wherein a virtual sensor (set point vs. actual responses measured by a sensor) is created for the entire operating range of each recipe obtained by operation of semiconductor processing equipment as processing chamber 310 of FIG. 3 or processing modules 410-416 of FIG. 4. The method increments the recipe count M by one at 506, and proceeds to 508.

At 508, one or more process chambers are operated according to recipe M. The method advances to 510, wherein measurements are collected from sensors such as sensors 352 and 354 of chamber 310. At 512, for each sensor, a respective process set point is associated with a corresponding sensor measurement value (response) over the entire operating range of recipe M. At 514, a determination is made as to whether the chamber will transition to another recipe. If so, the method returns to 506, and the recipe counter value increments by one so that pairs of time indexed process set points and corresponding actual sensor measurements are collected over the entire range of the next recipe by repetition of 508, 510, and 512. If the determination is made at 514 that the chamber will continue to operate according to the current recipe, the process advances to 516.

Figure 6A:
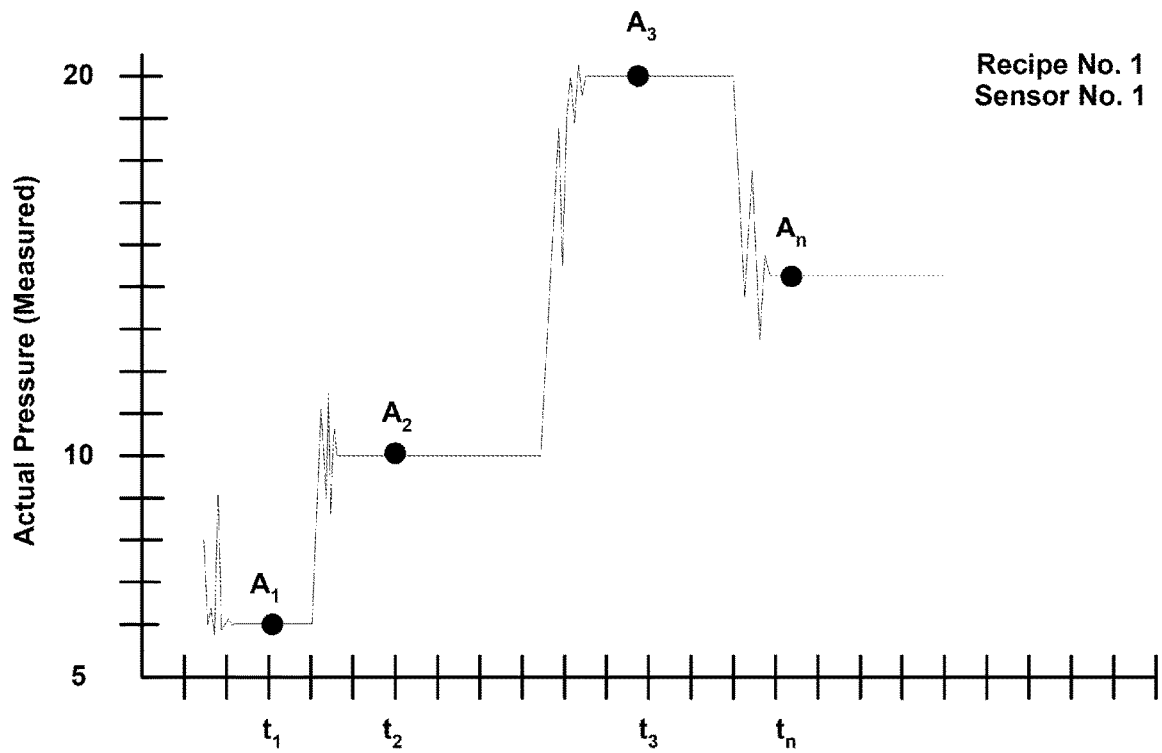
FIGS. 6A and 6B are graphical representations of sensor output responses as a function of some typical process inputs (i.e., "set points"), acquired during the device manufacturing process according to at least some embodiments of the present disclosure.
Figure 6B:
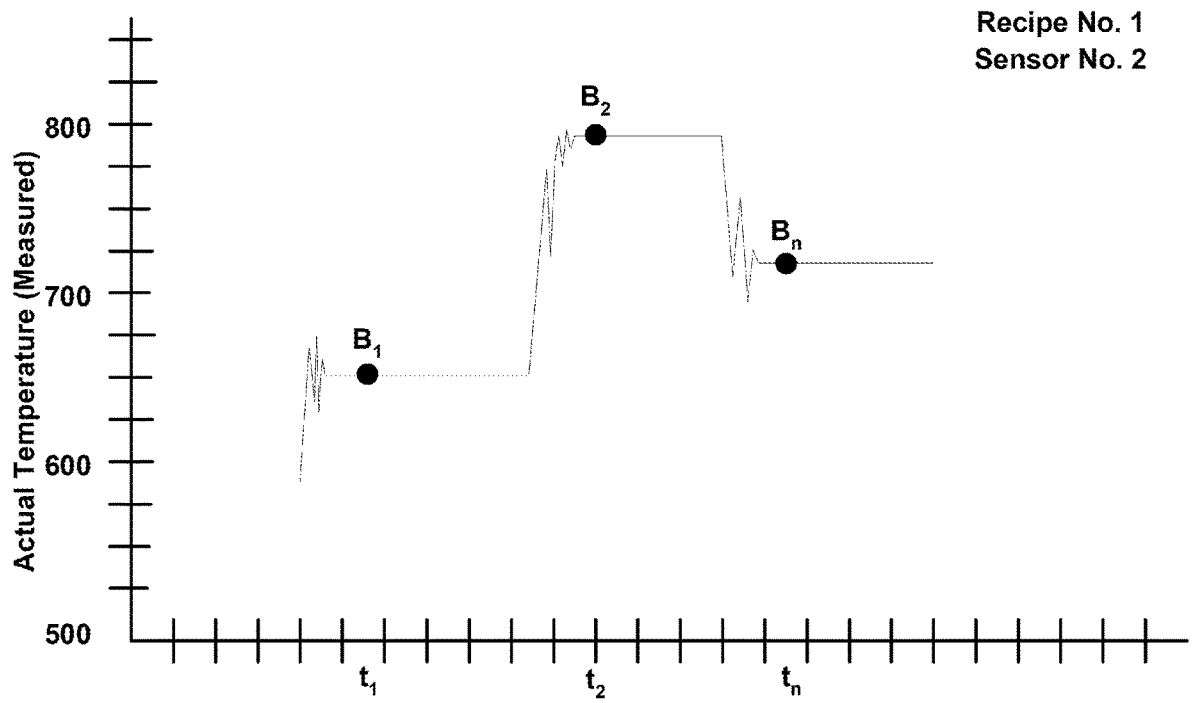

At 516, a plurality of time indexed pairs are selected for each sensor to obtain a virtual sensor for every recipe encountered by the associated chamber. According to some embodiments, responses returned by the sensors of a chamber operated according to recipe M are governed by a linear relationship to one another across the entire operating range of the recipe. According to such embodiments, a plurality of the stored sensor response-set point pairs are selected and used to model a virtual sensor having a linear performance curve for modeling anticipated sensor behavior at each set point. In some embodiments, 516 includes selecting a first set point and actual measured value (sensor response) pair corresponding to a lower limit of the operating range encountered by a semiconductor processing chamber. In some embodiments, 516 further includes selecting a second set point and actual measured value pair corresponding to an upper limit of the operating range encountered by the semiconductor processing chamber. In some embodiments 516 further includes selecting one or more intermediate set point and actual measured value pair(s) falling between the aforementioned upper limit and the lower limit. Graphic representations of chamber set-point and sensor measurement pairs associated with pressure sensor 352 and temperature sensor 354 of FIG. 3 are depicted in FIGS. 6A and 6B, respectively.

Figure 7A:
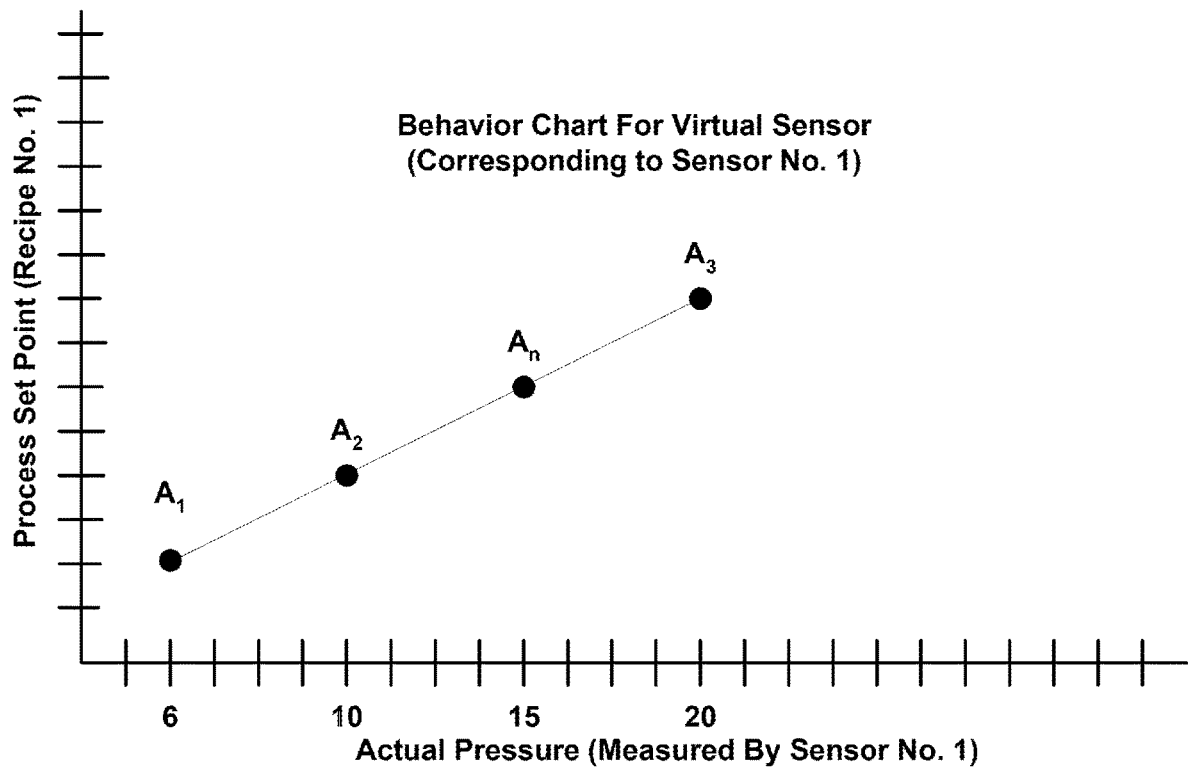
FIGS. 7A and 7B are graphical representations of virtual sensors derived from selected pairs of sensor output responses and corresponding set points associated with a region of sensor operation presumed to be predictable according to at least some embodiments of the present disclosure.
Figure 7B:
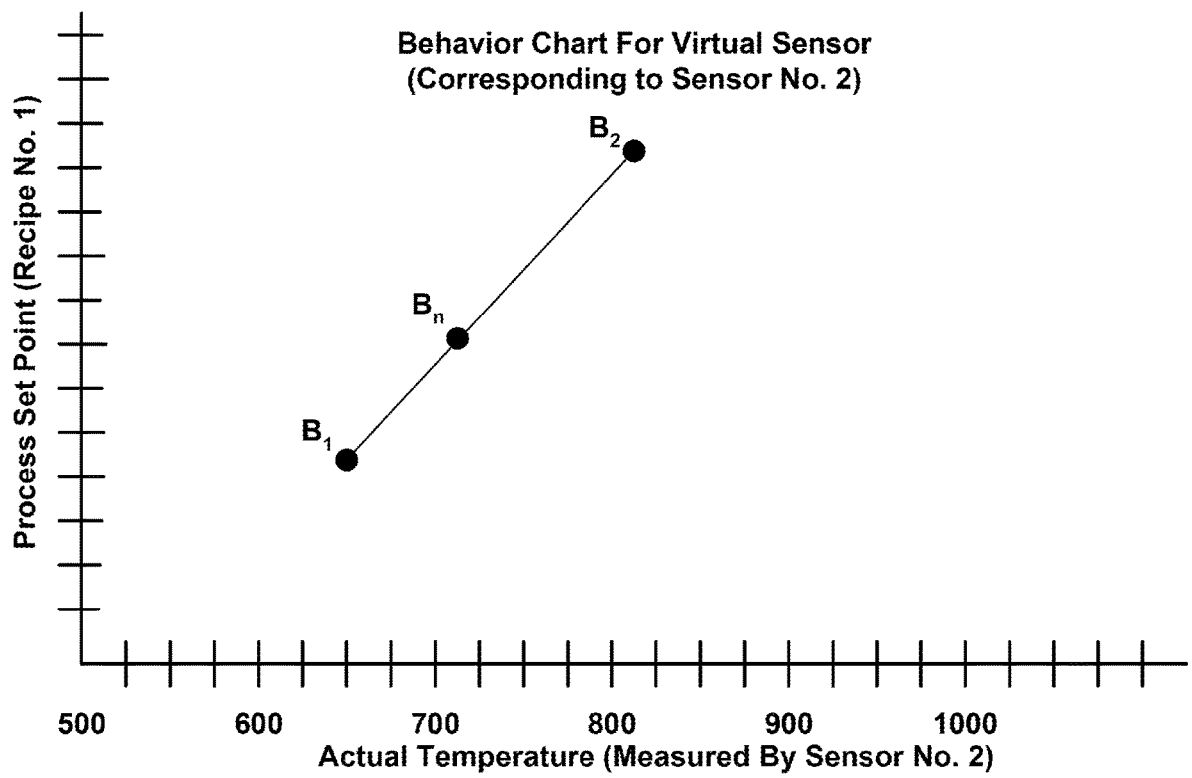

According to one or more embodiments, the selected time-indexed pairs are represented as points in an orthogonal coordinate system to identify a linear portion corresponding to the operating range. A slope characterizing the aforementioned linear relationship, which relationship is presumed for purposes of embodiments described herein to govern a sensor's behavior over a predicted operating range of the sensor, is derived using a conventional method to define a virtual sensor. The performance curve of a virtual sensor is used as the basis for assessing the validity of subsequent measurements captured by a corresponding real sensor. An exemplary way to obtain the performance curve of a virtual sensor is to implement an automated line fitting algorithm as, for example, the method of least squares. The performance charts for the virtual sensors derived from sensor 1 responses (pressure measurements from sensor 352 as a function of process set point) and sensor 2 responses (temperature measurements from sensor 354 as a function of process set point), during operation of chamber 310 according to Recipe No. 1, are depicted in FIGS. 7A and 7B, respectively.

Figure 8A:
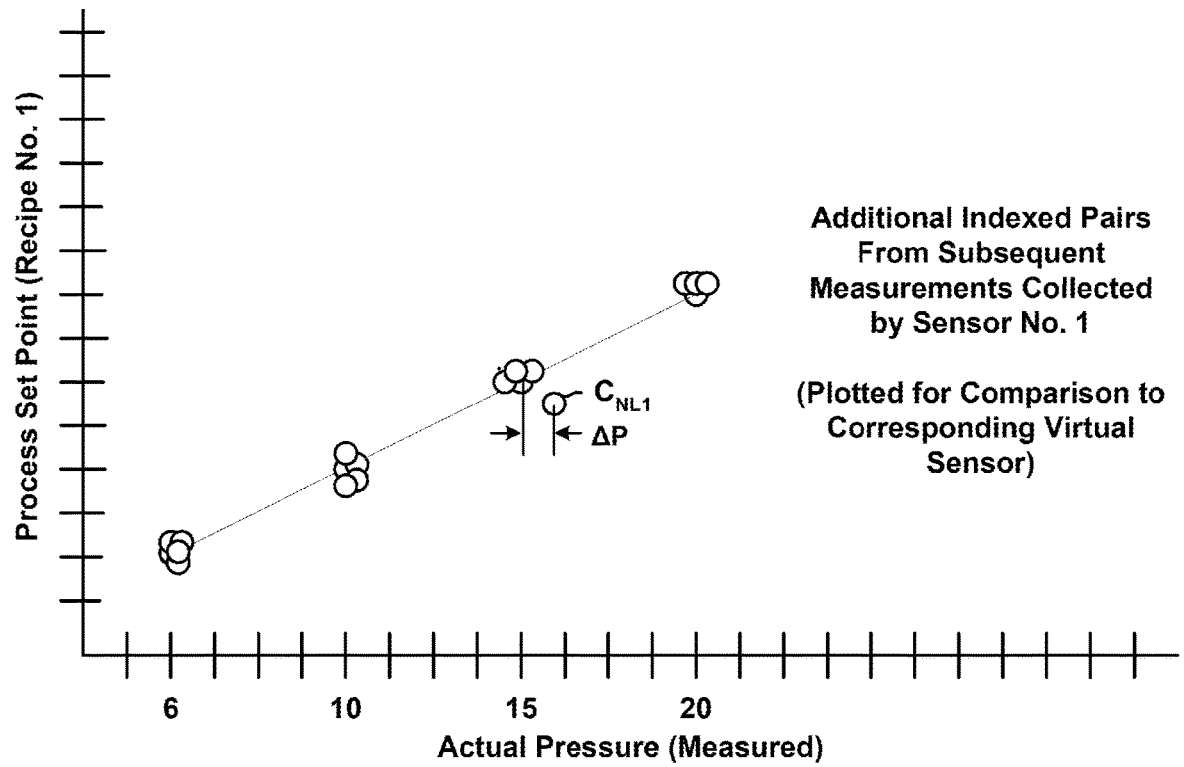
FIGS. 8A and 8B are graphical representations of further sensor output responses as a function of process set points, acquired during subsequent operation of a semiconductor processing system, useful to evaluate sensors against a corresponding virtual sensor according to at least some embodiments of the present disclosure.
Figure 8B:
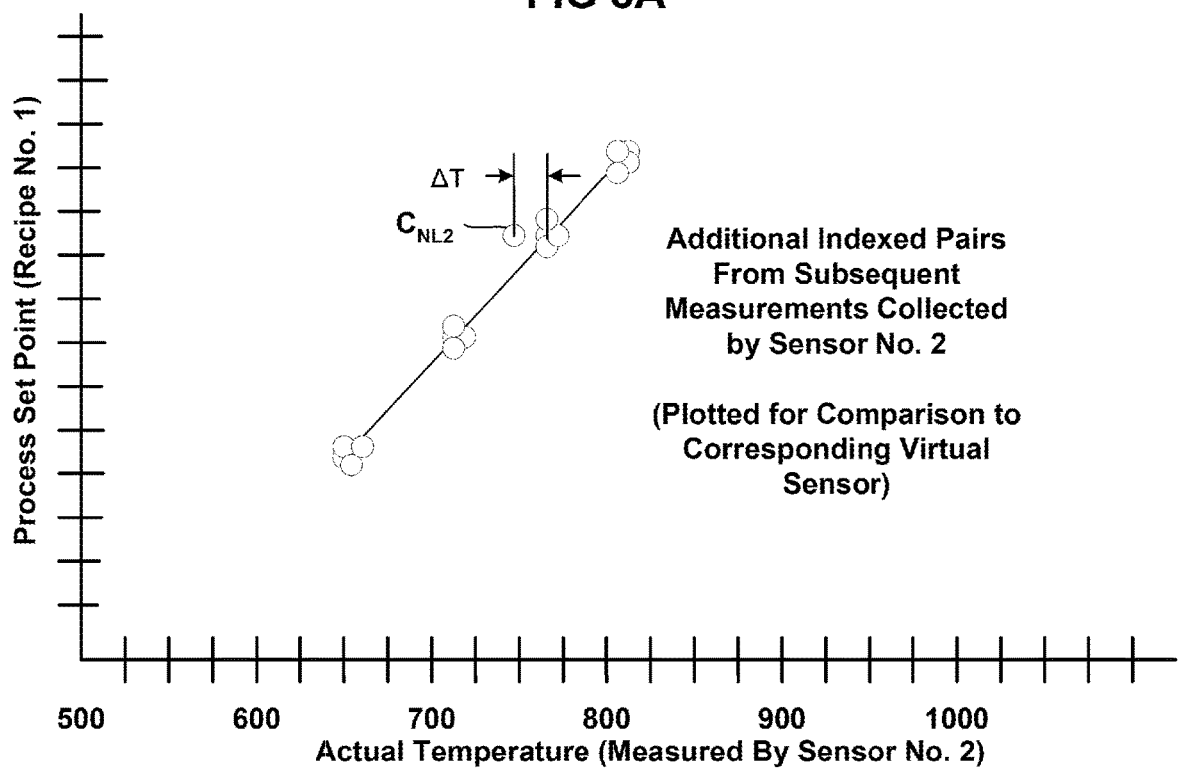

Within continued reference to FIG. 5, the process proceeds to 520 wherein operation of one or more chambers as chamber 310 of FIG. 3 or 410 to 422 of FIG. 4, continues and, at 522, additional sensor measurements are collected. The accumulation of collected measurements from sensors 352 and 354 during operation of recipe 1 are shown in FIGS. 8A and 8B, respectively. At 524, if not yet time to evaluate the health of sensors associated with the processing operation, the process returns to 520. If, however, it is time to evaluate the health of sensors associated with the processing operation, the method 500 proceeds to 526 wherein a determination is made as to whether any of the additional measurements collected for a sensor fall deviate from the sensor values predicted, for the applicable process set point, by the corresponding virtual sensor. If not, the method returns to 520 and processing continues in an uninterrupted fashion. If so, however, the process advances to 528, and an alerting message is generated and transmitted so that maintenance can be performed (e.g., at 530) in a timely manner. According to some embodiments, the determination at 526 is performed after each recipe run in order to reduce the chance of a substrate (or wafer) excursion. As used herein, deviating sensor values are those which are either offset as a group relative to the performance chart for the virtual sensor, or which are sufficiently outside the predicted linear range (e.g., differences greater than or equal to $\Delta T$ or $\Delta P$) as to represent a risk of substrate excursion or other intolerable defect.

While the foregoing is directed to embodiments of the present disclosure, other and further embodiments of the disclosure may be devised without departing from the basic scope thereof.

The invention claimed is:

1. A computer-implemented method for automated monitoring of a measurement performance of at least one sensor having a predictable measurement performance over a range of operating set points of a tool of a semiconductor manufacturing process, the method comprising:
   while operating the tool during the semiconductor manufacturing process:
      collecting actual measurement data from the at least one sensor at more than one operating set point of the tool of the semiconductor manufacturing process;
      storing the collected measurement data along with an indication of a respective set point at which the actual measurement was taken and a respective time during which the actual measurement was taken to create time-indexed pairs of operating set points and respective measurement data;
      predicting expected measurement data for at least one of the at least one sensor for at least one operating set point of the tool of the manufacturing process based on the collected, actual measurement data from the at least one sensor at the more than one operating set point of the tool of the manufacturing process according to the predictable measurement performance of the at least one sensor;
      collecting additional actual measurement data from the at least one sensor from at least one of the more than one operating set point of the tool of the manufacturing process for which expected measurement data was predicted;
      evaluating a measurement performance of the at least one sensor by comparing the additional actual measurement data from the at least one sensor at a set point of the tool of the manufacturing process with expected measurement data predicted for the at least one sensor at the set point of the tool of the manufacturing process; and
      in response to the additional actual measurement data from the at least one sensor at the set point of the tool of the manufacturing process not being within a predicted range of the expected measurement data for the at least one sensor at the set point of the tool of the manufacturing process, transmitting a communication to cause maintenance to be performed on at least one of the at least one sensor or the tool of the manufacturing process.

2. The method of claim 1, wherein the predicting expected measurement data for at least one of the at least one sensor comprises modeling the measurement performance of the at least one of the at least one sensor using at least two of the time-indexed pairs.

3. The method of claim 2, wherein the modeling includes representing the at least two of the time-indexed pairs as points in an orthogonal coordinate system to identify a linear portion corresponding to the range of the operating set points of the tool.

4. The method of claim 3, further comprising:
determining if a sensor response to a set point change reflected in a stored, time-indexed pair is non-linear or offset relative to the identified linear portion; and
generating and transmitting an alerting message if a sensor response to a set point change reflected in a time-indexed pair is determined to be non-linear or offset relative to the identified linear portion.

5. The method of claim 1, wherein the at least one sensor comprises a temperature sensor or a pressure sensor.

6. A computer-implemented method for automated monitoring of a measurement performance of at least one sensor having a predictable measurement performance over a range of operating set points of a tool of a semiconductor manufacturing process, wherein the at least one sensor provides data sensitive to at least one of a tool state or a process state change, the method comprising:
while operating the tool during the semiconductor manufacturing process:
collecting, at each of a plurality of points in time, actual measurement data from the at least one sensor at more than one operating set point of the tool of the semiconductor manufacturing process associated with a tool state or a process state;
storing the collected measurement data along with an indication of a respective set point at which the actual measurement was taken and a respective time during which the actual measurement was taken to create time-indexed pairs of operating set points and respective measurement data;
predicting expected measurement data for at least one of the at least one sensor for at least one operating set point of the tool of the semiconductor manufacturing process based on the collected, actual measurement data from the at least one sensor at the more than one operating set point of the tool of the semiconductor manufacturing process according to the predictable measurement performance of the at least one sensor, wherein the predicting comprises:
selecting a first time-indexed pair of operating set points and respective actual measurement data corresponding to a lower limit of an operating range encountered by the tool and the at least one sensor across at least one of a plurality of recipes implemented during the semiconductor manufacturing process;
selecting a second time-indexed pair of operating set points and respective actual measurement data corresponding to an upper limit of an operating range encountered by the tool and the at least one sensor across the at least one of the plurality of recipes implemented during the semiconductor manufacturing process;
selecting a third time-indexed pair of operating set points and respective actual measurement data corresponding to an intermediate point of an operating range encountered by the tool and the at least one sensor across the at least one of the plurality of recipes implemented during the semiconductor manufacturing process; and
modeling the at least one sensor using the first, second and third time-indexed pairs;
collecting additional actual measurement data from the at least one sensor from at least one of the more than one operating set point of the tool of the semiconductor manufacturing process for which expected measurement data was predicted;
evaluating a measurement performance of the at least one sensor by comparing the additional actual measurement data from the at least one sensor at a set point of the tool of the semiconductor manufacturing process with expected measurement data predicted for the at least one sensor at the set point of the tool of the semiconductor manufacturing process; and
in response to the additional actual measurement data from the at least one sensor at a set point of the tool of the semiconductor manufacturing process not being within a predicted range of the expected measurement data for the at least one sensor at the set point of the tool of the semiconductor manufacturing process, automatically initiating maintenance on at least one of the at least one sensor or the tool of the semiconductor manufacturing process.

7. The method of claim 6, wherein the tool employs a plurality of recipes in a fabrication of semiconductor devices, each recipe having a plurality of set points at different points in time.

8. The method of claim 7, wherein the evaluating comprises modeling the at least one sensor, using at least some of the time-indexed pairs, as a virtual sensor to confirm predictability of behavior over an operating range encountered by the at least one sensor during the fabrication process.

9. The method of claim 7, wherein set point and actual measured value pairs are selected and the modeling is performed after each recipe run to reduce a probability of substrate excursions.

10. The method of claim 6, wherein the modeling comprises representing the first, second and third time-indexed pairs as points in an orthogonal coordinate system to identify a linear portion corresponding to the operating range encountered by the tool, and
wherein the evaluating comprises determining if a measurement response of the at least one sensor to a set point change reflected in a stored, time-indexed pair is non-linear or offset relative to the identified linear portion.

11. The method of claim 10, further comprising generating and transmitting an alarm message if a measurement response of the at least one sensor to a set point change reflected in a time-indexed pair is determined to be one of non-linear or offset relative to the identified linear portion.

12. A system for implementing an automatic and non-disruptive sensor health monitoring scheme for at least one sensor having a predictable measurement performance over a range of operating set points during execution of a recipe on a substrate within a processing chamber of a plasma processing system as part of a device fabrication process, comprising:
at least one sensor configured to collect sensor data to facilitate monitoring operating set points during execution of the recipe;
an interface configured to receive sensor data collected from the at least one sensor; and an analytical computer system communicably coupled with said interface and having a memory and a processor configured to execute instructions stored in memory, the processor being operative to execute instructions:
- to store collected sensor data from the at least one sensor in response to operating set point changes;
- to associate each actual measurement returned by the at least one sensor with an indication of a respective operating set point at which the actual measurement was taken and a respective time during which the actual measurement was taken to create time-indexed pairs of operating set points and respective measurement data;
- to predict expected measurement data for at least one of the at least one sensor for at least one operating set point based on collected, actual measurement data from the at least one sensor at the more than one operating set point according to the predictable measurement performance of the at least one sensor;
- to evaluate a health of the at least one sensor based by comparing additional actual measurement data from the at least one sensor at a set point, with expected measurement data predicted for the at least one sensor at the set point; and
- in response to the additional actual measurement data from the at least one sensor at the set point not being within a predicted range of the expected measurement data for the at least one sensor at the set point, transmitting a communication to cause maintenance to be performed on the at least one sensor.

13. The system of claim 12, wherein stored instructions executable by the processor to evaluate sensor health include instructions to model the at least one sensor, using at least some of the time-indexed pairs, as a virtual sensor for use in confirming predictability of behavior over an operating range encountered by the at least one sensor during execution of the recipe.

14. The system of claim 13, wherein stored instructions executable by the processor to model the sensor as a virtual sensor include instructions to represent selected time-indexed pairs as points in an orthogonal coordinate system and to identify a linear portion corresponding to the operating range encountered by the at least one sensor during execution of the recipe.

15. The system of claim 14, wherein stored instructions executable by the processor to evaluate health of the at least one sensor include instructions to determine if a sensor response, to a set point change reflected in a stored time-indexed pair, is non-linear or offset relative to the identified linear portion.

16. The system of claim 15, wherein stored instructions are executable by the processor to generate or transmit an alarm message if a sensor response, to a set point change reflected in a time-indexed pair, is determined to be non-linear or offset relative to the identified linear portion.

17. The system of claim 12, wherein stored instructions executable by the processor to evaluate sensor health include instructions:
- to select a first set point and sensor measurement pair corresponding to a lower limit of an operating range encountered during execution of the recipe;
- to select a second set point and sensor measurement pair corresponding to an upper limit of an operating range encountered during execution of the recipe;
- to select a third set point and sensor measurement pair corresponding to an intermediate point encountered during execution of the recipe; and
- to model the at least one sensor, using the selected pairs, as a virtual sensor for use in confirming predictability of behavior over the operating range.

18. The system of claim 17, wherein stored instructions executable by the processor to model the sensor as a virtual sensor include instructions to represent selected time-indexed pairs as points in an orthogonal coordinate system and to identify a linear portion corresponding to the operating range encountered by the at least one sensor during execution of the recipe.

19. The system of claim 18, wherein stored instructions executable by the processor to evaluate health of the sensor include instructions to determine if a sensor response, to a set point change reflected in a stored time-indexed pair, is non-linear or offset relative to the identified linear portion, and
wherein stored instructions are executable by the processor to generate and transmit an alarm message if a sensor response, to a set point change reflected in a time-indexed pair, is determined to be non-linear or offset relative to the identified linear portion.

* * * * *